United States Patent
Tang et al.

(10) Patent No.: US 8,665,033 B2
(45) Date of Patent: Mar. 4, 2014

(54) VARACTORLESS TUNABLE OSCILLATOR

(75) Inventors: Yiwu Tang, San Diego, CA (US); Jaehyouk Choi, Ulsan (KR); Jongmin Park, San Diego, CA (US); Chiewcharn Narathong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/030,843

(22) Filed: Feb. 18, 2011

(65) Prior Publication Data

US 2012/0212300 A1    Aug. 23, 2012

(51) Int. Cl.
*H03B 5/08* (2006.01)
*H03B 5/18* (2006.01)

(52) U.S. Cl.
USPC ... 331/167; 331/36 L; 331/36 R; 331/117 FE; 331/117 R; 331/135

(58) Field of Classification Search
USPC ...... 331/36 L, 36 R, 117 FE, 117 R, 135, 167
See application file for complete search history.

(56) References Cited

U.S. PATENT DOCUMENTS

| | | | | |
|---|---|---|---|---|
| 5,142,249 A | * | 8/1992 | Hirotomi | 331/57 |
| 5,463,353 A | * | 10/1995 | Countryman et al. | 331/2 |
| 5,831,486 A | * | 11/1998 | Wehbi | 331/57 |
| 5,994,985 A | | 11/1999 | Pehlke et al. | |
| 6,396,358 B1 | * | 5/2002 | Poss et al. | 331/57 |
| 7,053,723 B2 | * | 5/2006 | Fredriksson | 331/135 |
| 2004/0066236 A1 | | 4/2004 | Fujimoto et al. | |
| 2006/0232348 A1 | * | 10/2006 | Hino | 331/167 |
| 2006/0244499 A1 | * | 11/2006 | Miyata et al. | 327/156 |
| 2008/0164950 A1 | * | 7/2008 | Kelkar et al. | 331/16 |
| 2008/0174378 A1 | | 7/2008 | Cusmai et al. | |
| 2011/0057736 A1 | * | 3/2011 | Badillo | 331/57 |

OTHER PUBLICATIONS

Chang, et al., "A 0.18-μm CMOS 16-GHz Varactorless LC-VCO with 1.2-GHz Tuning Range," IEEE Asian Solid-State Circuits Conference, pp. 107-110, Nov. 12-14, 2007, Jeju, Korea.
Kwok, et al., "A 23-to-29GHz Differentially Tuned Varactorless VCO in 0.13μm CMOS," IEEE International Solid-State Circuits Conference, IEEE International Digest of Technical Papers, pp. 194-596, Feb. 13, 2007.
Cusmai et al., "A Magnetically Tuned Quadrature Oscillator", IEEE Journal of Solid-State Circuits, pp. 2870-2877, vol. 42, No. 12, Dec. 2007.
International Search Report and Written Opinion—PCT/US2012/025098—ISA/EPO—May 16, 2012.

* cited by examiner

*Primary Examiner* — Arnold Kinkead
*Assistant Examiner* — Richard Tan
(74) *Attorney, Agent, or Firm* — Kenyon S. Jenckes

(57) ABSTRACT

A tunable oscillator circuit is disclosed. The tunable oscillator circuit includes an inductor/capacitor (LC) tank circuit comprising a primary inductor coupled in parallel with a first capacitor bank. The LC tank resonates to produce an oscillating voltage at a frequency. The tunable oscillator circuit also includes a 90 degree phase shift buffer coupled to the LC tank and a transconductor. The transconductor is coupled to the 90 degree phase shift buffer and a secondary inductor. The tunable oscillator circuit also includes a secondary inductor that is inductively coupled to the primary inductor and receives a gain-scaled oscillating current from the transconductor. By changing the transconductance, the gain-scaled oscillating current in the secondary inductor will change, thus the effective primary inductance and the oscillation frequency can be tuned.

28 Claims, 11 Drawing Sheets

VARACTORLESS TUNABLE OSCILLATOR

TECHNICAL FIELD

The present disclosure relates generally to communication systems. More specifically, the present disclosure relates to a varactorless tunable oscillator.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

However, like other portable electronic devices, mobile devices may have limited battery life. Along with other types of circuits, oscillators consume current during operation, thus shortening battery life. Furthermore, it may be desirable to maximize the tuning range of an oscillator, minimize the amount of noise in the oscillator signals and improve tuning linearity for signal quality. Therefore, benefits may be realized by a varactorless tunable oscillator.

SUMMARY OF THE INVENTION

A tunable oscillator circuit is disclosed. The tunable oscillator circuit includes an inductor/capacitor (LC) tank circuit comprising a primary inductor coupled in parallel with a first capacitor bank. The LC tank resonates to produce an oscillating voltage at a frequency. The tunable oscillator circuit also includes a 90 degree phase shift buffer coupled to the LC tank and a transconductor. The transconductor is coupled to the 90 degree phase shift buffer and a secondary inductor. The tunable oscillator circuit also includes a secondary inductor that is inductively coupled to the primary inductor and receives a gain-scaled oscillating current from the transconductor.

In one configuration, the 90 degree phase shift buffer phase-shifts the oscillating voltage by 90 degrees. The transconductor may convert the shifted oscillating voltage into the gain-scaled oscillating current. The transconductor may be a metal-oxide-semiconductor field effect transistor (MOSFET). The MOSFET may receive a tuning current at a source node or a drain node that changes the gain-scaled oscillating current passed to the secondary inductor, an effective inductance of the primary inductor and the frequency of the oscillating voltage. Alternatively the MOSFET may receive a tuning voltage at a gate node that changes the gain-scaled oscillating current passed to the secondary inductor, an effective inductance of the primary inductor and the frequency of the oscillating voltage.

The 90 degree phase shift buffer may include a capacitor with a first node coupled to the inductor/capacitor (LC) tank and a second node coupled to a first node of a resistor. The 90 degree phase shift buffer may also include an n-type metal-oxide-semiconductor field effect transistor (NMOSFET) with a source node coupled to ground. The 90 degree phase shift buffer may also include a p-type metal-oxide-semiconductor field effect transistor (PMOSFET) with a source node coupled to a reference voltage (Vdd), wherein gates of the NMOSFET and PMOSFET are coupled to the second node of the capacitor and the first node of the resistor. The 90 degree phase shift buffer may also include a shunt capacitor bank with a first node coupled to a second node of the resistor, the transconductor and the drains of the NMOSFET and the PMOSFET, wherein a second node of the shunt capacitor bank is coupled to switched ground. The shunt capacitor bank may be programmable to create a different capacitance based on process or temperature during operation of the tunable oscillator circuit.

An integrated circuit for inductively tuning an oscillator is also disclosed. The integrated circuit includes an inductor/capacitor (LC) tank circuit comprising a primary inductor coupled in parallel with a first capacitor bank, wherein the LC tank resonates to produce an oscillating voltage at a frequency. The integrated circuit also includes a 90 degree phase shift buffer coupled to the LC tank and a transconductor. The transconductor is coupled to the 90 degree phase shift buffer and a secondary inductor. The integrated circuit also includes a secondary inductor that is inductively coupled to the primary inductor and receives a gain-scaled oscillating current from the transconductor.

A tunable oscillator circuit is also disclosed. The tunable oscillator circuit includes means for generating an oscillating voltage using a first capacitor bank and a primary inductor. The tunable oscillator circuit also includes means for buffering and phase-shifting the oscillating voltage. The tunable oscillator circuit also includes means for converting the shifted oscillating voltage into a gain-scaled oscillating current. The tunable oscillator circuit also includes means for changing a frequency of the oscillating voltage by changing the effective inductance of the primary inductor using the oscillating current.

A method for inductively tuning an oscillator is also disclosed. An oscillating voltage is generated using a first capacitor bank and a primary inductor. The oscillating voltage is buffered and phase-shifted using a 90 degree phase shift buffer. The shifted oscillating voltage is converted into a gain-scaled oscillating current using a transconductor. A frequency of the oscillating voltage is changed by changing the effective inductance of the primary inductor using the oscillating current.

DETAILED DESCRIPTION

The present systems and methods may describe a radio frequency (RF) oscillator that may be used in a frequency synthesizer. More specifically, a varactorless, highly linear inductive tuning current controlled oscillator (ICO). As used herein, the term "varactorless" refers to the characteristic of not having varactor arrays for the purpose of fine frequency tuning or temperature compensation. The present systems and methods may use a coarse-tuning capacitor bank, but inductive tuning (not varactors) may be used for fine tuning and temperature compensation. The oscillation frequency of the oscillator described herein may be tuned through inductive coupling using a tuning current and it may also be configured as a voltage controlled oscillator (VCO). One of the advantages may be a relatively linear gain ($K_{ICO}$) that is used by wideband phase/frequency modulation techniques. The tuning circuitry may impose a relatively small capacitive load to the oscillator tank, which may achieve a relatively high maximum tunable frequency.

Figure 1:
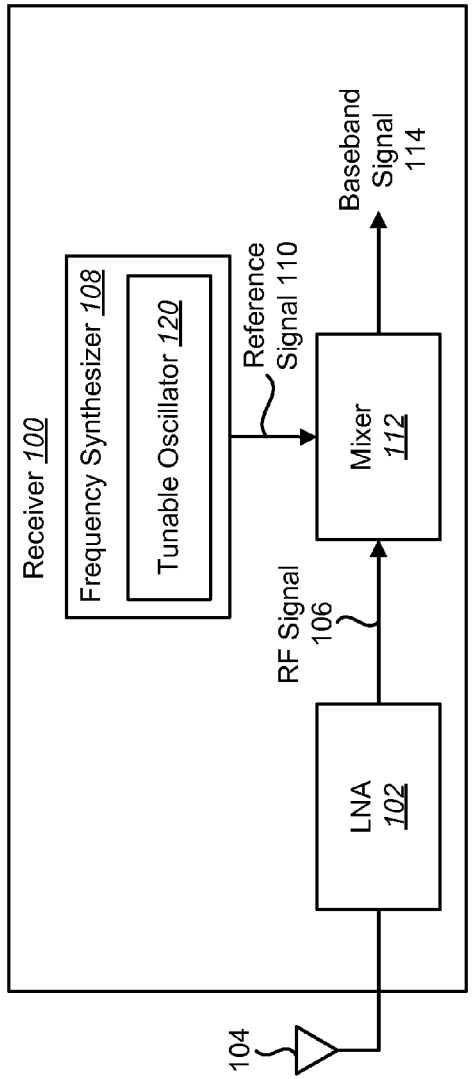
FIG. 1 is a block diagram illustrating a receiver.

FIG. 1 is a block diagram illustrating a receiver 100. The receiver 100 may be part of a mobile device or base station designed for wireless communication. The receiver 100 may include, among other things, a low noise amplifier (LNA) 102, a frequency synthesizer 108 and a mixer 112. The LNA 102 may receive a wireless communication signal from an antenna 104. The LNA 102 may amplify the received signal to usable levels and produce a radio frequency (RF) signal 106, i.e., a representation of the original signal sent. The frequency synthesizer 108 may output a reference signal 110 with a frequency directed to a particular application. The frequency synthesizer 108 may be capable of producing different frequencies. Specifically, the frequency synthesizer 108 may use a tunable oscillator 120 that is controlled by an input current or an input voltage to produce the reference signal 110. For example, the tunable oscillator 120 may be a varactorless tunable oscillator with relatively linear gain and low noise and power consumption. Although illustrated in the receiver 100, the frequency synthesizer 108 may be used in various applications in a mobile device or base station designed for wireless communication. The mixer 112 may receive the RF signal 106 from the LNA 102 and the reference signal 110 from the frequency synthesizer 108 and produce a baseband signal 114. The baseband signal 114 may be the actual reconstructed audio received by a microphone on a transmitting device, e.g., voiced speech or other kinds of data. Thus, the receiver 100 may use the mixer 112 to reconstruct the baseband signal 114.

Figure 2:
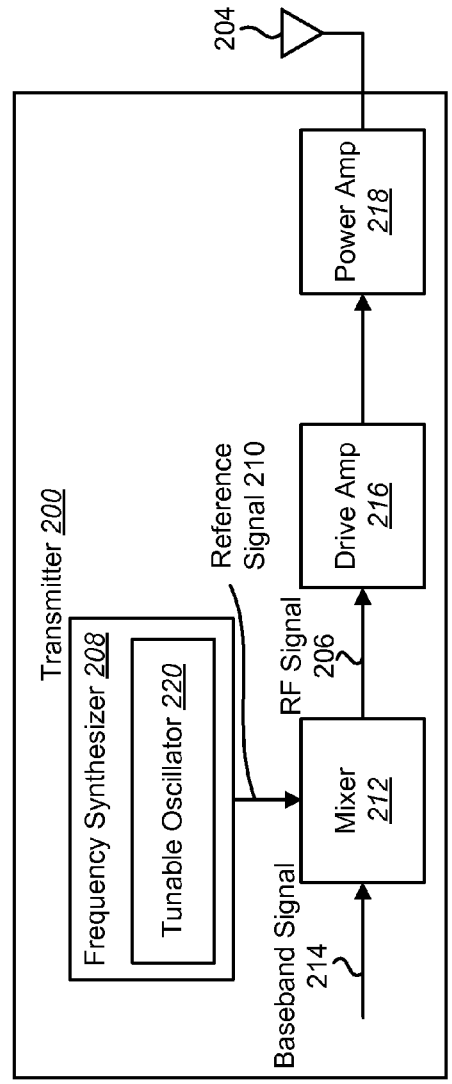
FIG. 2 is a block diagram illustrating a transmitter.

FIG. 2 is a block diagram illustrating a transmitter 200. The transmitter 200 may be part of a wireless device that may also include the receiver 100 illustrated in FIG. 1. The transmitter 200 may include, among other things, a frequency synthesizer 208, a mixer 212, a drive amplifier 216 and a power amplifier 218. Like before, the frequency synthesizer 208 may use a tunable oscillator 220 to produce the reference signal 210, e.g., a varactorless tunable oscillator. The mixer 212 may receive a reference signal 210 and a baseband signal 214 (e.g., voiced speech), and produce an RF signal 206. In other words, the transmitter 200 may use the mixer 212 to produce a modulated, high frequency RF signal 206 to be transmitted. Before the RF signal 206 is transmitted via an antenna 204, it may be amplified by a drive amplifier 216, a power amplifier 218 or both. Thus, the transmitter 200 may use the mixer 212 to construct an RF signal 206 for transmission.

Figure 3:
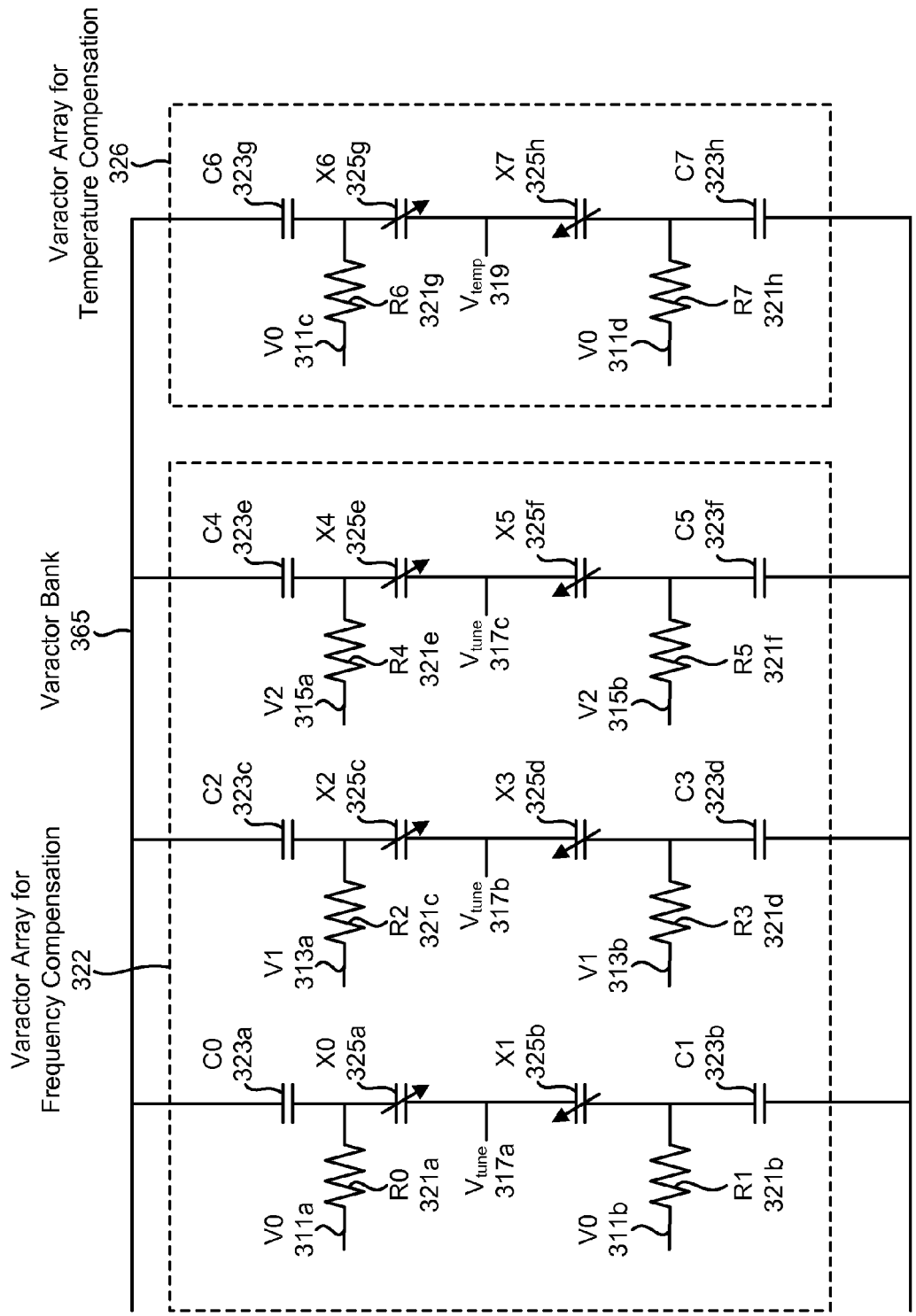
FIG. 3 is a circuit diagram illustrating a capacitor bank.

FIG. 3 is a circuit diagram illustrating a varactor bank 365. In phase modulation transmitters, a highly linear voltage controlled oscillator (VCO) may be used for acceptable performance, e.g., as measured by an error vector magnitude (EVM). Without compensation, VCOs using varactors as frequency tuning devices may be intrinsically nonlinear with a VCO gain ($K_{vco}$) variation of +/−100% over a tuning voltage ($V_{tune}$) 317a-c and frequency. One possible way to compensate for nonlinearities may be with varactors in a capacitor bank 365.

The varactor bank 365 may include a varactor array for frequency compensation 322 and a varactor array for temperature compensation 326. The varactor array for frequency compensation 322 may compensate for nonlinearities in the VCO gain ($K_{vco}$) using multiple varactors (X0-X5) 325a-f with different bias voltages. At lower frequencies (e.g., in lower frequency bands), more varactors (X0-X5) 325a-f may be used for VCO gain ($K_{vco}$) compensation than at higher frequencies. In addition to the varactors (X0-X5) 325a-f, the varactor array for frequency compensation 322 may include multiple capacitors (C0-C5) 323a-f, resistors (R0-R5) 321a-f, and linearization control signals (V0-V2) 311a-b, 313a-b, 315a-b. For example, the first linearization control signal (V0) 311a-b may be received at resistor R0 321a and resistor R1 321b to selectively include the effective capacitance of C0 323a and C1 323b in the capacitor bank 365, respectively. Similarly, the second linearization control signal (V1) 313a-b may be received at resistor R2 321c and resistor R3 321d to selectively include the effective capacitance of C2 323c and C3 323d in the capacitor bank 365, respectively. Similarly, the third linearization control signal (V2) 315a-b may be received at resistor R4 321e and resistor R5 321f to selectively include the effective capacitance of C4 323e and C5 323f in the capacitor bank 365, respectively.

In operation, the capacitance of the varactors (X0-X5) 325a-f may vary depending on the voltage difference of its two terminals. For example, the capacitance of X0 325a may be determined by V0 311a and $V_{tune}$ 317a. Similarly, the capacitance of X2 325c may be determined by V1 313a and $V_{tune}$ 317b. Because the capacitance of the varactors (X0-X5) 325a-f varies nonlinearly with this voltage difference, it makes $K_{vco}$ nonlinear. By having different V0, V1 and V2, the operating point of the varactors (X0-X5) 325a-f may be shifted, thus partially linearizing its $K_{vco}$ characteristic.

The varactor array for temperature compensation 326 may compensate for temperature variations in the VCO gain ($K_{vco}$) using multiple varactors (X6-X7) 325g-h with different bias voltages. For example, the first linearization control signal (V0) 311c-d may be received at resistor R6 321g and resistor R7 321h to include the effective capacitance of C6 323g and C7 323h in the capacitor bank 365, respectively. However, the temperature varactors (X6-X7) 325g-h may be biased using a proportional to absolute temperature (PTAT) temperature coefficient (i.e., $V_{temp}$ 319) instead of $V_{tune}$ 317a-c.

This type of $K_{vco}$ compensation (i.e., using a varactor array for frequency compensation 322 and/or using a varactor array for temperature compensation 326) may have disadvantages.

Specifically, the $K_{vco}$ in a varactor-tuned oscillator may be given according to Equation (1):

$$k_{VCO} = -2\pi^2 f_0^3 \frac{dC_{Varactor}}{dV_{tune}} \quad (1)$$

where $f_0$ is the resonant frequency of the oscillator, and $$\frac{dC_{Varactor}}{dV_{tune}}$$

is the change in the capacitance of the varactors 325a-h as a function of the change in $V_{tune}$ 317a-c. Therefore, $K_{vco}$ may be proportional to $f_0^3$ and nonlinear over $V_{tune}$ 317a-c due to the nonlinearity in $$\frac{dC_{Varactor}}{dV_{tune}}.$$

For example, even with the varactor arrays, there may still be a large variation in the VCO gain ($K_{vco}$) over $V_{tune}$ 317a-c after linearization (e.g., 15% over $V_{tune}$, such as 8 MHz), which may not be able to meet a bandwidth requirement for some wireless communication protocols, e.g., 3rd Generation Partnership Project's GSM EDGE Radio Access Network Evolution-Data Optimized (GERAN-EV) or Wideband Code Division Multiple Access (WCDMA). Additionally, the compensation varactor arrays 322, 326 may impose a relatively large parasitic capacitance that limits maximum tunable frequency and use a large amount of silicon area (along with the bias generation circuitry).

One possible varactorless tunable oscillator configuration may use two quadrature oscillators. However, quadrature oscillators may use a large area on an integrated circuit and consume a large amount of power. Furthermore, mismatches between the two quadrature oscillators may be important for $K_{ICO}$ linearity, and $K_{ICO}$ calibration may be unavailable. Lastly, without buffers between the cores and secondary loops of the quadrature oscillators, phase performance may be degraded.

Figure 4:
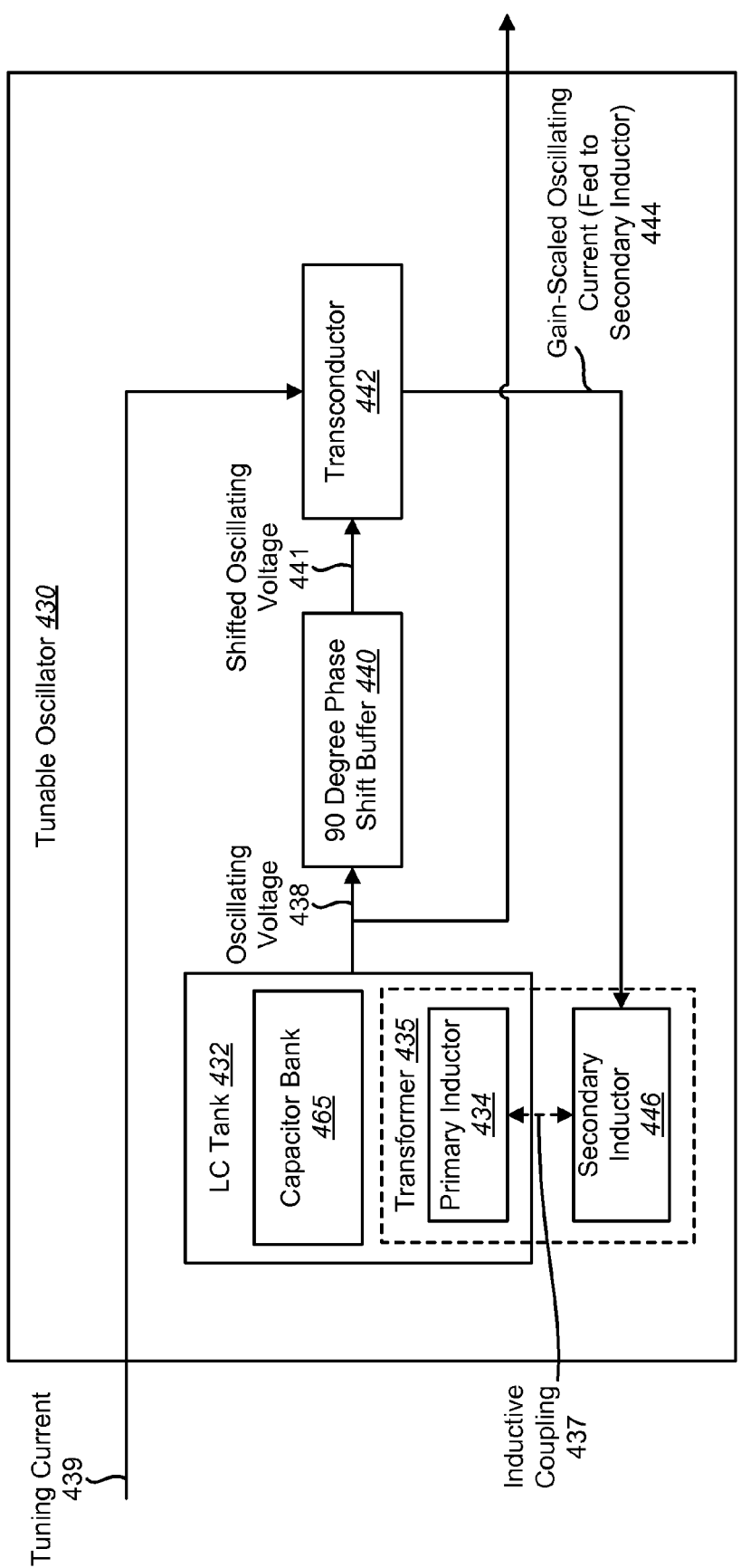
FIG. 4 is a block diagram illustrating a tunable oscillator.

FIG. 4 is a block diagram illustrating a tunable oscillator 430. The tunable oscillator 430 may include an inductor/capacitor (LC) tank 432, a 90 degree phase shift buffer 440, a transconductor 442 and a secondary inductor 446. The oscillator 430 may perform inductive tuning using a transformer 435, i.e., the combination of a primary inductor 434 in the LC tank 432 coupled to the secondary inductor 446 using inductive coupling 437. In other words, the tunable oscillator 430 may not use varactors to tune the frequency. Instead, the transformer 435 secondary coil (i.e., the secondary inductor 446) current inductively couples with the primary coil (i.e., the primary inductor 434) current, which changes the effective inductance of the primary inductor 434. The primary inductor 434 and a capacitor bank 465 may then resonate to produce an oscillating voltage 438 with a new frequency.

The secondary inductor 446 current may be generated from the oscillating voltage 438 through the 90 degree phase shift buffer 440 to produce a shifted oscillating voltage 441. The transconductor (Gm) 442 may receive the shifted oscillating voltage 441 and produce a gain-scaled oscillating current 444 that is fed to the secondary inductor 446. In other words, the transconductor 442 may apply a gain to its output current based on the input shifted oscillating voltage 441. The transconductor 442 may be controlled by a tuning current 439 to affect the gain applied. As discussed above, the gain-scaled oscillating current 444 may then change the effective inductance of the primary inductor 434. Therefore, the tunable oscillator 430 may tune the frequency of the oscillating voltage 438, without varactors, using a tuning current 439 or a tuning voltage (not shown).

Figure 5:
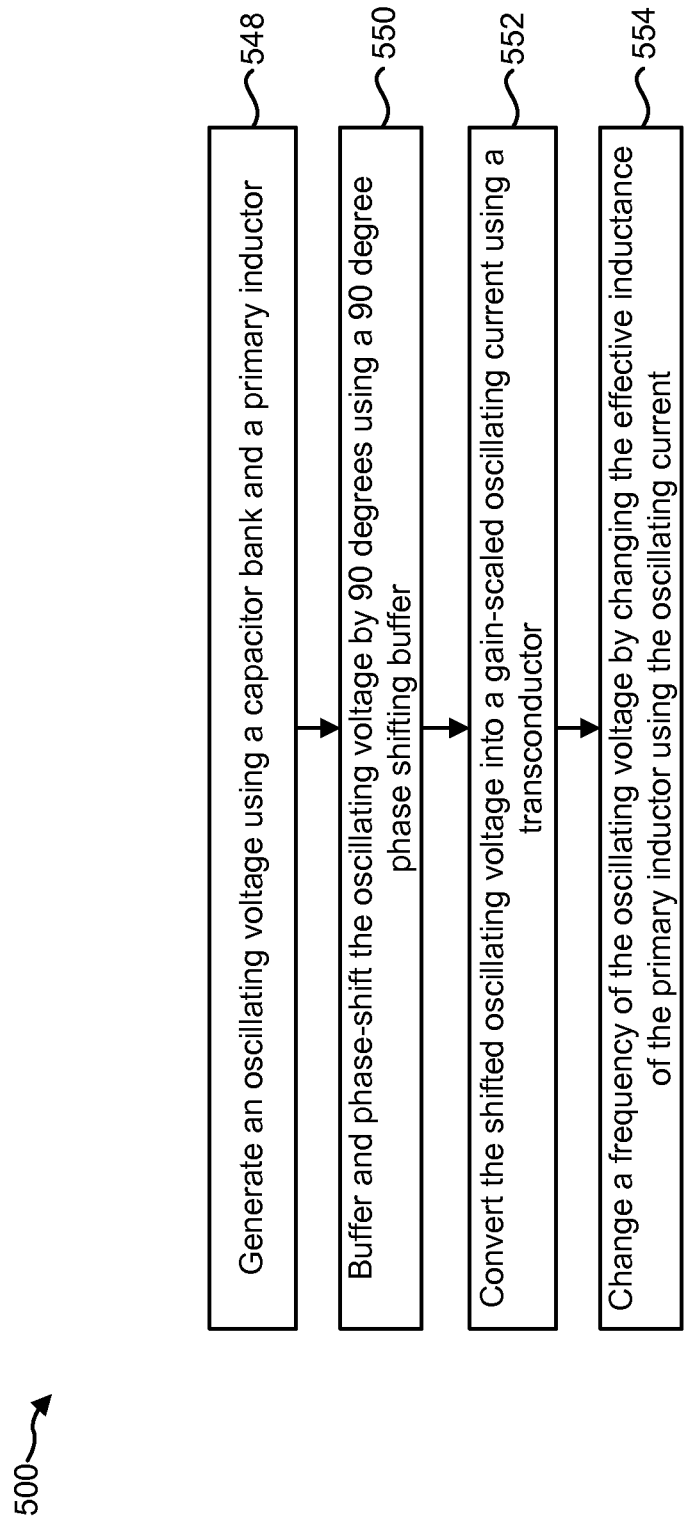
FIG. 5 is a flow diagram illustrating a method for inductively tuning an oscillator.

FIG. 5 is a flow diagram illustrating a method 500 for inductively tuning an oscillator. For example, the method 500 may be performed by the tunable oscillator 430 illustrated in FIG. 4. The tunable oscillator 430 may generate 548 an oscillating voltage 438 using a capacitor bank 465 and a primary inductor 434, i.e., resonance using an LC tank 432. The tunable oscillator 430 may also buffer 550 and phase-shift the oscillating voltage 438 by 90 degrees using a 90 degree phase shift buffer 440. The tunable oscillator 430 may also convert 552 the shifted oscillating voltage 441 into a gain-scaled current 444 using a transconductor 442, e.g., a transistor controlled by a tuning current 439. The gain-scaled current 444 may be fed to the secondary inductor 446. The tunable oscillator 430 may also change 554 the frequency of the oscillating voltage 438 by changing the effective inductance of the primary inductor 434 using the oscillating current 444 in the secondary inductor 446. In other words, the gain-scaled oscillating current 444 may inductively couple with the primary inductor 434 current and change the effective inductance of the primary inductor 434, thus changing the oscillating frequency.

Figure 6:
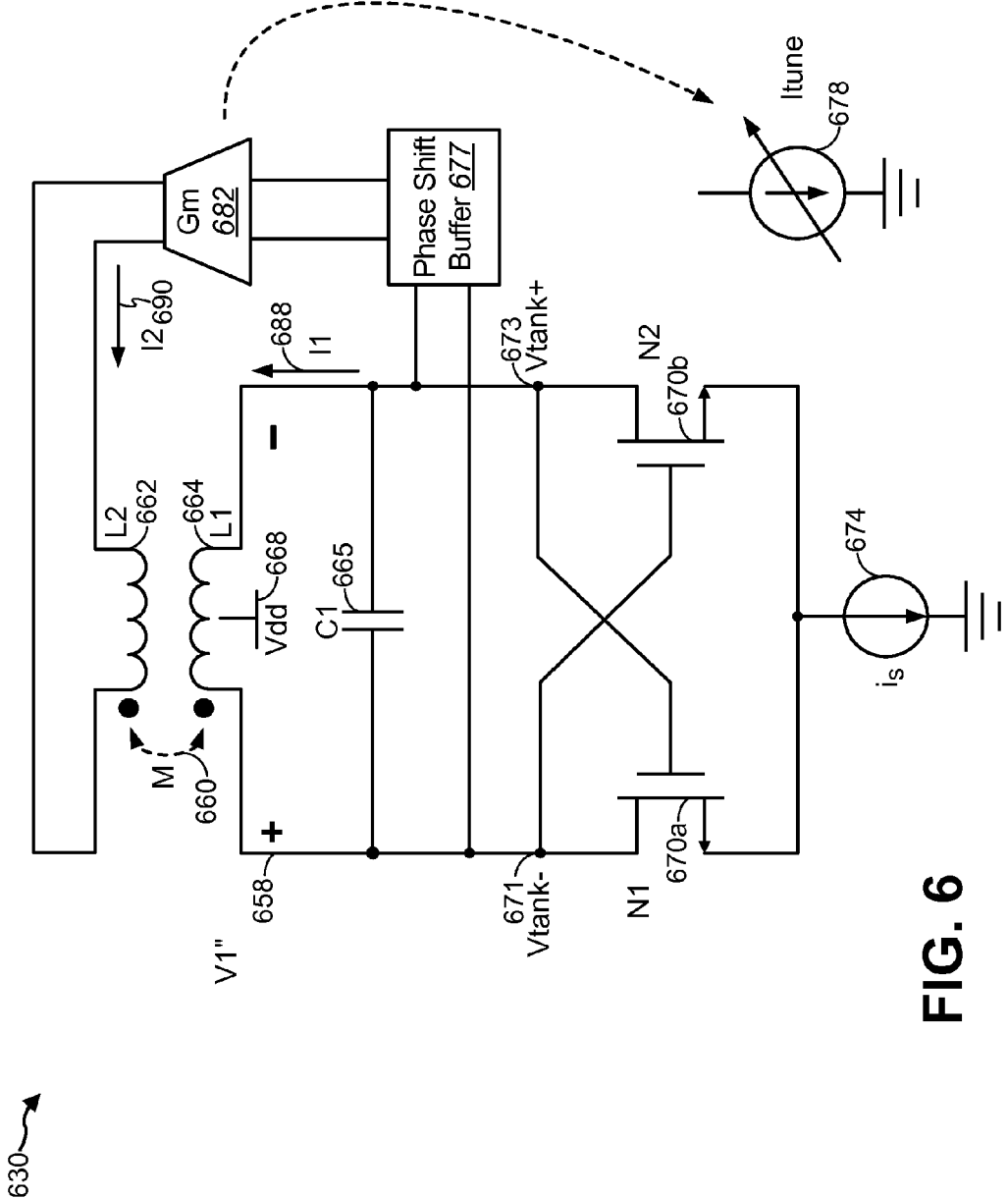
FIG. 6 is a circuit diagram illustrating a tunable oscillator.

FIG. 6 is a circuit diagram illustrating a tunable oscillator 630. The oscillator 630 core may include a first n-type metal-oxide-semiconductor (NMOS) field effect transistor (NMOSFET) N1 670a with the source of N1 670a coupled to ground and the drain of N1 670a coupled to a Vtank− output 671 of the oscillator 630 core. The gate of N1 670a may be coupled to a Vtank+ output 673 of the oscillator 630 core. The oscillator 630 core may also include a second NMOSFET N2 670b, with the source of N2 670b coupled to ground and the drain of N2 670b coupled to the Vtank+ output 673. The gate of N2 670b may be coupled to the Vtank− output 671.

The oscillator 630 core may also include an inductor/capacitor (LC) tank, i.e., the combination of a primary inductor (L1) 664 and a bank of switched capacitors (modeled as C1 665) coupled in a resonant circuit designed to generate an oscillating signal. The inductor/capacitor (LC) tank may connect Vtank+ 673 and Vtank− 671. The capacitor bank (C1) 665 may be used for coarse frequency tuning. Current across a secondary inductor (L2) 662 may inductively couple with current across the primary inductor (L1) 664. This may change the effective inductance of the primary inductor (L1) 664, thus changing oscillation frequency. In other words, the primary inductor (L1) 664 may be inductively coupled with the secondary inductor (L2) 662 with a mutual inductance of M 660. There may be a center tap from the primary inductor (L1) 664 that is coupled to Vdd 668 and a center tap from the secondary inductor (L2) 662 that is coupled to Vdd 668, e.g., a regulated voltage supply.

The outputs (i.e., Vtank− 671 and Vtank+ 673) of the oscillator 630 core may be input into a phase shift buffer 677. The phase shift buffer 677 may shift the core output by 90 degrees so the primary inductor current (I1) 688 and secondary inductor current (I2) 690 are aligned in-phase or 180 degree out-of-phase. Without a 90 degree phase shifter 677, the primary inductor current (I1) 688 and the secondary inductor current (I2) 690 may not be in-phase, thus frequency tuning may not be linear and the tuning range may be limited.

The phase shift buffer 677 may be implemented with a resistor/capacitor (RC) filter described below. The resistor (not shown) may also be used for the inverter buffer self bias. A shunt capacitor (not shown) in the phase shift buffer 677 may be programmable to compensate over process and temperature. Furthermore, without the buffering of the phase shift buffer 677 between the core and the secondary loop, phase noise and performance may be degraded.

The transconductor (Gm) 682 may be controlled by a tuning current (Itune) 678 or a tuning voltage (not shown), e.g., generated by a phase locked loop. By tuning the transconductance ($g_m$), the secondary inductor current (I2) 690 may change, thus tuning the effective primary inductance and oscillation frequency. Therefore, the transconductor (Gm) 682 uses inductive coupling between the primary inductor (L1) 664 and the secondary inductor (L2) 662 to tune the frequency of output signal (V1″) 658 even though there is no direct current coupling between the primary inductor (L1) 664 and the secondary inductor (L2) 662. In other words, the transconductor (Gm) 682 changes the amount of current (I2) 690 through the second inductor (L2) 662.

To illustrate the linearity of the oscillator 630 in FIG. 6, an impedance transfer function of the resonance tank may be used. V1″ 658 (i.e., the voltage measured across the primary inductor (L1) 664) may be given according to Equation (2):

$$v_1 = sL_1 i_1 + sM i_2 + R_1 i_1 \quad (2)$$

where s is the complex frequency of the oscillator 630, $L_1$ is the inductance of the primary inductor (L1) 664, M is the mutual inductance between the primary inductor (L1) 664 and the secondary inductor (L2) 662, $R_1$ is the parasitic resistance of the primary inductor (L1) 664, $i_1$ 688 is the current across the primary inductor (L1) 664 and $i_2$ 690 is the current across the secondary inductor (L2) 662. The primary inductor current (I1) 688 may be given according to Equation (3):

$$i_1 = i_s - sC_1 v_1 \quad (3)$$

where $C_1$ is the capacitance of the capacitor bank 665, $i_s$ 674 is the source current from the NMOSFETs (N1-N2) 670a-b (modeled as a current source). The secondary inductor current (I2) 690 may be given according to Equation (4):

$$i_2 = -\frac{A_1 v_1 G_m}{1 + \frac{s}{\omega_{ps}}} \approx -\frac{A_1 v_1 G_m}{\frac{s}{\omega_{ps}}} \quad (4)$$

because $\omega_{ps} \ll$ operating frequency band, where $\omega_{ps}$ is a pole from the phase shift buffer 677, $A_1$ is the gain of the phase shift buffer 677, and Gm is the transconductance of the transconductor 682. Therefore, the effective impedance of the resonance tank may be given by Equation (5):

$$v_1/i_1 = Z(s) = \frac{sL_1 + R_1}{s^2 C_1 L_1 + s C_1 R_1 + \omega_{ps} A_1 M G_m + 1} \quad (5)$$

For a steady-state sinusoidal alternating current (AC) signal, $s=j\omega$. Therefore, Equation (5) may be rewritten in Equation (6):

$$v_1/i_1 = Z(j\omega) = \frac{j\omega L_1 + R_1}{-\omega^2 C_1 L_1 + j\omega C_1 R_1 + A_1 M G_m \omega_{ps} + 1} \quad (6)$$

For oscillation, the imaginary part of the denominator should be zero according to Equation (7):

$$j\omega(-\omega^2 C_1 L_1^2 + L_1 - C_1 R_1^2 + A_1 M G_m \omega_{ps}) = 0 \quad (7)$$

The oscillation frequency, $\omega_{osc}$, may be given according to Equation (8):

$$\omega_{osc} = \omega_O \sqrt{\left(1 - \frac{1}{Q_O}\right) + A_1 M G_m \omega_{ps}} \quad (8)$$

where $\omega_0$ is the ideal resonant frequency of the LC tank in radians and $Q_0$ is the unloaded quality factor of the primary inductor (L1) 664. The gain ($k_{ICO}$) of the oscillator 630 may be given according to Equation (9):

$$k_{ICO} = \frac{\partial f_{osc}}{\partial G_m} = \frac{f_o \cdot A_1 M \omega_{ps}}{2} \cdot \frac{1}{\sqrt{\left(1 - \frac{1}{Q_O}\right) + A_1 M G_m \omega_{ps}}} \quad (9)$$

where $f_0$ is the ideal resonant frequency of the LC tank. Because the second term of Equation (9) is much less than the first term, $\omega_0$ may be rewritten according to Equation (10):

$$\omega_{osc} \approx \omega_O \left(1 - \frac{1}{Q_O} + \frac{A_1 M G_m \omega_{ps}}{2}\right) \quad (10)$$

where the mutual inductance (M) 860 may be given according to Equation (11):

$$M = k\sqrt{L_1 \cdot L_2} \quad (11)$$

where k is a coupling coefficient ($0 \leq k \leq 1$). The tunable oscillator 630 gain may be given according to Equation (12):

$$k_{ICO} = \frac{\partial f_{osc}}{\partial G_m} = f_o \cdot \frac{A_1 M \omega_{ps}}{2} \quad (12)$$

In large signal operation, $G_m \propto I_{tune}$. Therefore, the varactorless tunable oscillator 630 gain ($k_{ICO}$) may be a first-order function of $f_0$ and may be constant over Itune 678. In contrast, a VCO tuned with varactor arrays may have a gain according to Equation (13):

$$k_{VCO} = -2\pi^2 f_o^3 \cdot \frac{\partial C_{Varactor}}{\partial V_{tune}} \quad (12)$$

Therefore, a varactor array-tuned VCO may be a third-order function of $f_0$ with a nonlinear gain over Vtune.

Figure 7:
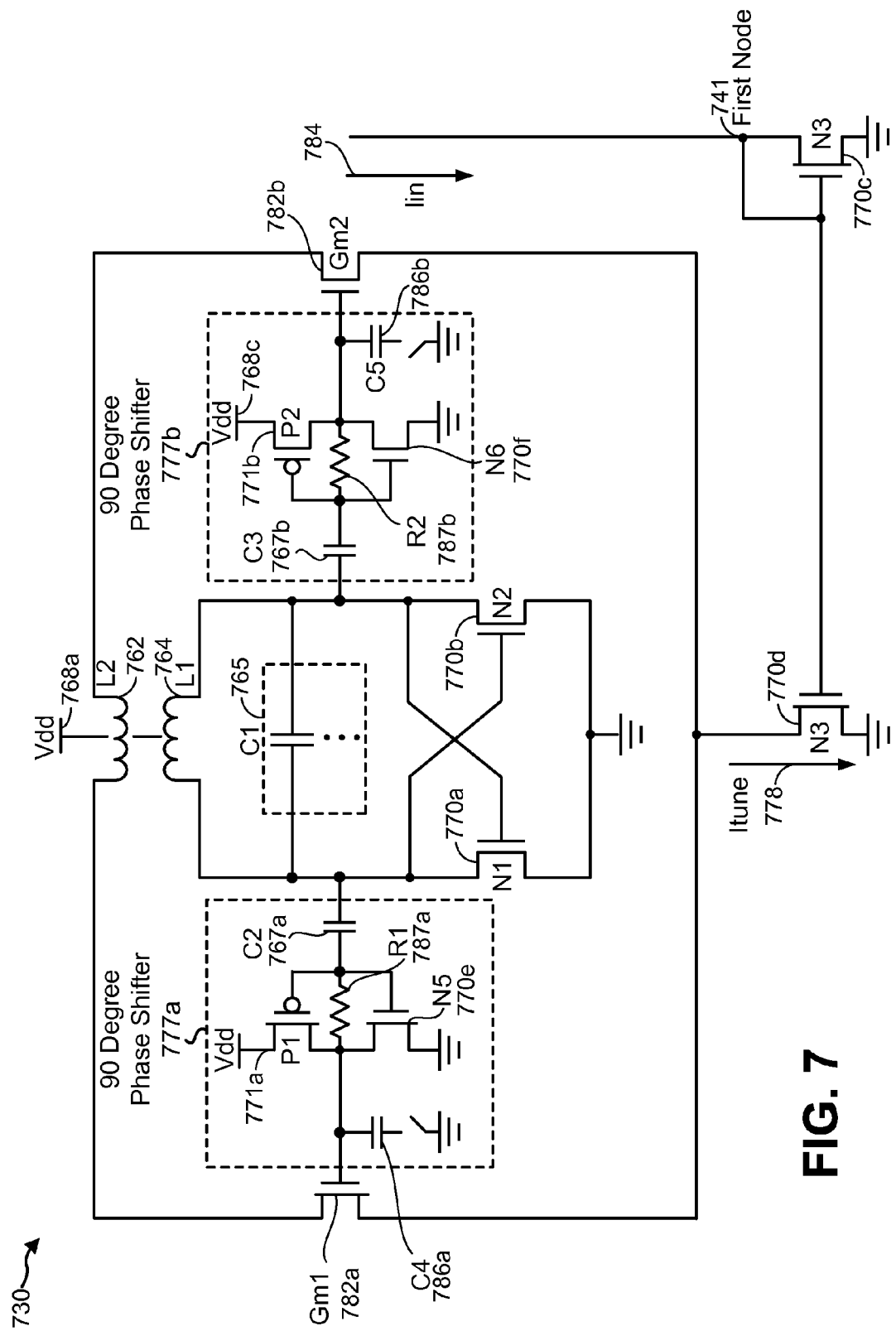
FIG. 7 is a circuit diagram illustrating another tunable oscillator.

FIG. 7 is a circuit diagram illustrating another tunable oscillator 730. The tunable oscillator 730 may include similar elements as the tunable oscillator 630 illustrated in FIG. 6. Specifically, the first NMOSFET (N1) 770a, second NMOSFET (N2) 770b, the capacitor bank (C1) 765, Vdd 768a-c supply, primary inductor (L1) 764 and secondary inductor (L2) 762 illustrated in FIG. 7 may correspond to and include similar functionality as the first NMOSFET (N1) 670a, second NMOSFET (N2) 670b, the capacitor bank (C1) 665, Vdd 668 supply, primary inductor (L1) 664 and secondary inductor (L2) 662 illustrated in FIG. 6, respectively.

As before, a transformer (i.e., the combination of the primary inductor (L1) 764 and secondary inductor (L2) 762) may perform inductive tuning of the oscillator 730. In other words, the current through the secondary inductor (L2) 762 may change the effective inductance of the primary inductor (L1) 764 and thus change the output frequency of the oscillator 730.

An input current ($I_{IN}$) 784 may be received at a first node 741, e.g., the drain or source of a third NMOSFET (N3) 770c. The input current ($I_{IN}$) 784 may be received from a current-mode digital-to-analog converter (IDAC), e.g., in a phase locked loop. The input current ($I_{IN}$) 784 may be mirrored in a fourth NMOSFET (N4) 770d to create the tuning current (Itune) 778 for the transconductors (Gm1-Gm2) 782a-b.

In this configuration, a first 90 degree phase shift buffer 777a receives one output of the oscillator 730 core, e.g., Vtank− 671. Similarly, a second 90 degree phase shift buffer 777b may receive the other output of the oscillator 730 core, e.g., Vtank+ 673. The 90 degree phase shift buffers 777a-b may shift their inputs by 90 degrees for primary inductor (L1) 764 and secondary inductor (L2) 762 alignment. The 90 degree phase shift buffers 777a-b may also perform noise reverse isolation and $K_{VCO}$ compensation with programmable shunt capacitor banks (C4-C5) 786a-b. The programmable shunt capacitor banks (C4-C5) 786a-b may be switched using, for example, 3 bit control signals (not shown).

In the 90 degree phase shift buffers 777a-b, the first series capacitor (C2) 767a and the second series capacitor (C3) 767b may combine with the first series resistor (R1) 787a and the second series resistor (R2) 787b, respectively, to phase shift the oscillator 730 tank outputs. The first p-type metal-oxide-semiconductor (PMOS) field effect transistor (PMOSFET) P1 771a and the second PMOSFET (P2) 771b combine with a fifth NMOSFET (N5) 770e and a sixth NMOSFET (N6) 770f, respectively, to invert and buffer the phase-shifted tank output and isolate the oscillator 730 core and the transconductors (Gm1-Gm2) 782a-b.

In one configuration, in the first 90 degree phase shifter 777a, the gates of the first PMOSFET (P1) 771a and the fifth NMOSFET (N5) 770e may be coupled together to the output of the first series capacitor (C2) 767a. The source of the first PMOSFET (P1) 771a may be coupled to Vdd 768b and the source of the fifth NMOSFET (N5) 770e may be coupled to ground. The drains of the first PMOSFET (P1) 771a and the fifth NMOSFET (N5) 770e may be coupled together to the input of the first programmable shunt capacitor (C4) 786a.

Similarly, in the second 90 degree phase shifter 777b, the gates of the second PMOSFET (P2) 771b and the sixth NMOSFET (N6) 770f may be coupled together to the output of the second series capacitor (C3) 767b. The source of the second PMOSFET (P2) 771b may be coupled to Vdd 768c and the source of the sixth NMOSFET (N6) 770f may be coupled to ground. The drains of the second PMOSFET (P2) 771b and the sixth NMOSFET (N6) 770f may be coupled together to the input of the second programmable shunt capacitor (C5) 786b.

The transconductors (Gm1-Gm2) 782a-b may be controlled by the tuning current (Itune) 778 or a tuning voltage. Itune 778 may be the drain bias current of the fourth NMOSFET (N4) 770d and may be the sum of the source current of Gm1 782a and Gm2 782b. Therefore, Itune 778 may be the bias current of Gm1 (782a) and Gm2 (782b) and may define their transconductance. Changing the tuning current (Itune) 778 via the input current ($I_{IN}$) 784 may change the current through the secondary inductor (L2) 762, thus tuning the effective primary inductance and oscillation frequency. This inductive, or indirect, coupling between the primary inductor (L1) 764 and the secondary inductor (L2) 762 may tune the frequency of output signal even though there is no direct current coupling between the primary inductor (L1) 764 and the secondary inductor (L2) 762.

This configuration may include several advantages. First, the oscillation frequency across the tuning current (Itune) 778 may be relatively linear, e.g., a tuning gain variation within +/−2% over 18 MHz, +/−6% over 40 MHz. Second, the maximum tunable frequency may be relatively high due to smaller parasitic capacitive loading from 90 degree phase shifter buffers 777a-b compared to that of varactor arrays. Third the tunable oscillator 730 may have comparable or better phase noise performance, current consumption and smaller die area than oscillators using varactor arrays.

Figure 8:
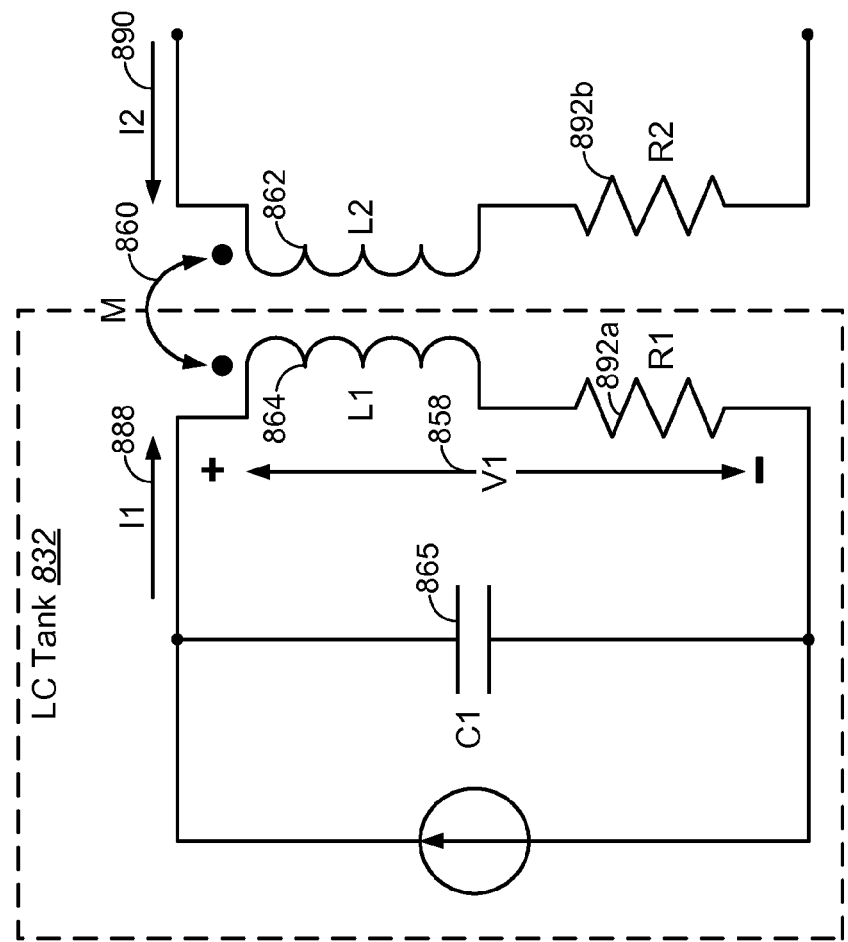
FIG. 8 is a circuit diagram illustrating an inductive frequency tuning mechanism.

FIG. 8 is a circuit diagram illustrating an inductive frequency tuning mechanism 831. The inductive frequency tuning mechanism 831 may include a subset of elements in the tunable oscillator 730 illustrated in FIG. 7. Specifically, the capacitor bank (C1) 865, primary inductor (L1) 864 and secondary inductor (L2) 862 illustrated in FIG. 8 may correspond to and include similar functionality as the capacitor bank (C1) 765, primary inductor (L1) 764 and secondary inductor (L2) 762 illustrated in FIG. 7, respectively. Furthermore, the first resistor (R1) 892a is the parasitic capacitance of the primary inductor (L1) 864 and the second resistor (R2) 892b is the parasitic capacitance of the primary inductor (L2) 862.

In this configuration, the voltage (V1) 858 across the primary inductor (L1) 864 may be given according to Equation (2) above. The mutual inductance (M) 860 may be given according to Equation (11) above. Therefore, a coefficient α may be introduced as a multiplicative factor for $i_1$ 888 in relation to $i_2$ 890 according to Equation (13):

$$i_2 = \alpha \cdot i_1 \quad (13)$$

where a positive α indicates that $i_1$ 888 and $i_2$ 890 are in-phase (i.e., positive coupling) and a negative α indicates that $i_1$ 888 and $i_2$ 890 are out-of-phase (i.e., negative coupling). Substituting M 860 and $i_2$ 890 with Equations (11) and (13), respectively, the voltage (V1) 858 across the LC tank 832 may be given according to Equation (14):

$$v_1 = s(L_1 + \alpha \cdot M) \cdot i_1 + R_1 i_1 \quad (14)$$

where ($L_1 + \alpha \cdot M$) is the effective inductance of the primary inductor (L1) 864. Therefore, the resonant frequency, $f_O$, of the tuning mechanism 831 may be given according to Equation (15):

$$f_o = \frac{1}{2\pi \cdot \sqrt{L_1 \cdot C_1}} \Rightarrow f_o' = \frac{1}{2\pi \cdot \sqrt{(L_1 + \alpha \cdot M) \cdot C_1}} \quad (15)$$

Therefore, the resonant frequency, $f_O'$, may be controlled by changing $i_2$ 890 using the transconductor (not shown). For example, the input current ($I_{IN}$) 784 illustrated in FIG. 7 may be mirrored to create the tuning current (Itune) 778, which may control $i_2$ 890 produced by the transconductor 782a-b.

Figure 9:
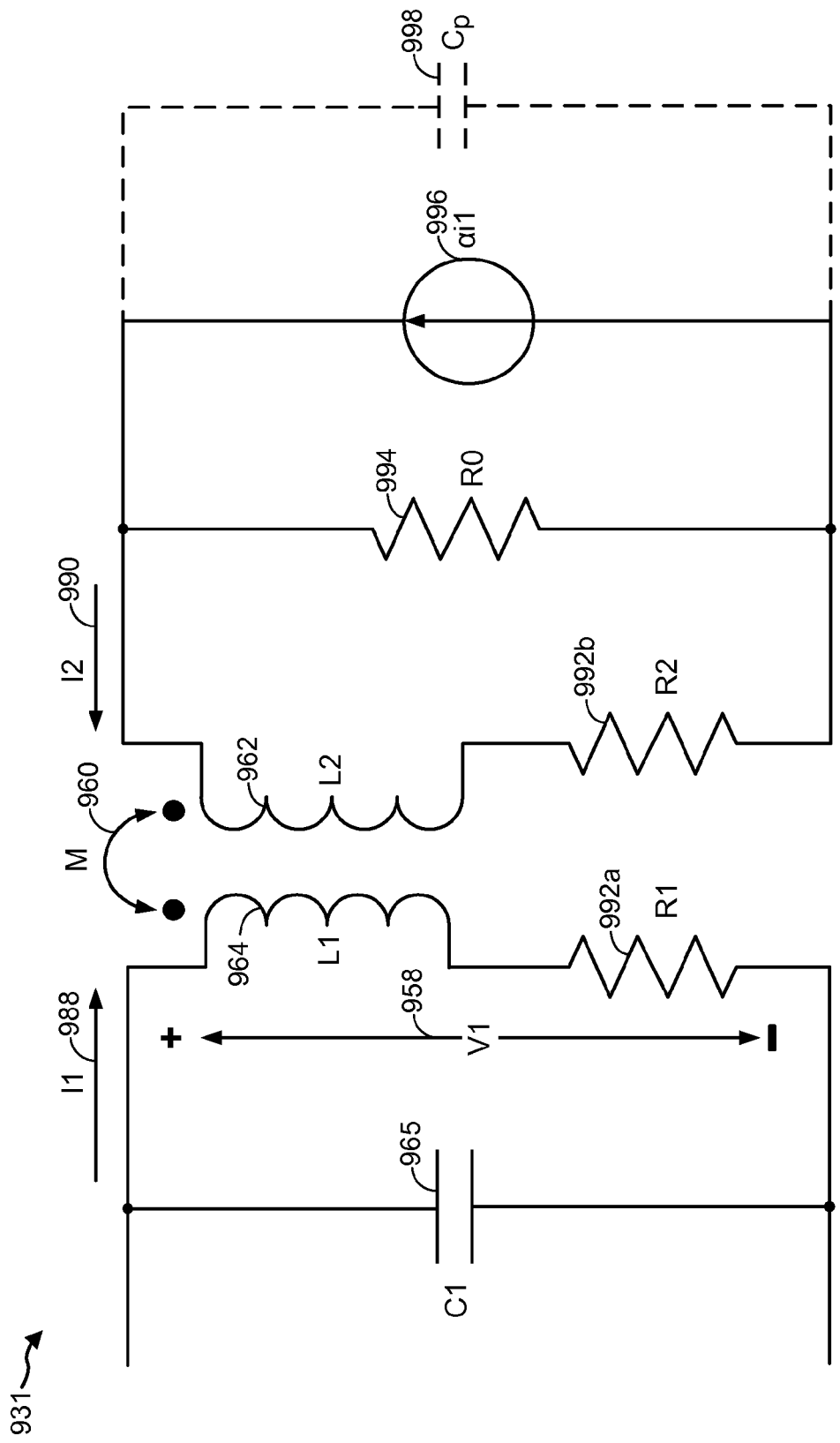
FIG. 9 is a circuit diagram illustrating an inductive frequency tuning mechanism.

FIG. 9 is a circuit diagram illustrating an inductive frequency tuning mechanism 931. The inductive frequency tuning mechanism 931 may include similar elements to the tuning mechanism 831 illustrated in FIG. 8. Specifically, the capacitor bank (C1) 965, mutual inductance (M) 960, first resistor (R1) 992a, second resistor (R2) 992b, primary inductor current (I1) 988, secondary inductor current (I2) 990, primary inductor (L1) 964 and secondary inductor (L2) 962 illustrated in FIG. 9 may correspond to and include similar functionality as the capacitor bank (C1) 865, mutual inductance (M) 860, first resistor (R1) 892a, second resistor (R2) 892b, primary inductor current (I1) 888, secondary inductor current (I2) 890, primary inductor (L1) 864 and secondary inductor (L2) 862 illustrated in FIG. 8, respectively. The tuning mechanism 931 is shown having a current source of $\alpha i_1$ 996, however, this current may actually be received from a transconductor, e.g., Gm1-Gm2 782a-b. Furthermore, the tuning mechanism 931 is shown having a capacitor (Cp) 998 to model the parasitic capacitance of a secondary stage (not shown).

In this configuration, the voltage (V1) 958 across the LC tank may be given according to Equation (16) above.

$$v_1 = j\omega L_1 i_1 + j\omega M i_2 + R_1 i_1 \quad (16)$$

Additionally, the secondary inductor current (I2) 990 may be given according to Equation (17):

$$i_2 = \frac{r_0}{r_0 + j\omega L_2 + R_2} \cdot \alpha i_1 \quad (17)$$

where $r_0$ 994 is the parallel effective resistance of the secondary inductor (L2) 962. Therefore, the impedance (Z1) of the primary inductor may be given according to Equation (18):

$$Z_1 = j\omega L_1 + j\omega M \cdot \frac{\alpha \cdot r_o}{r_o + R_2 + j\omega L_2} + R_1 \quad (18)$$

$$= \left(R_1 + \frac{\alpha \cdot r_o \cdot \omega^2 L_2 \cdot M}{(r_o + R_2)^2 + \omega^2 L_2^2}\right) + j\left(\omega L_1 + \omega \frac{\alpha \cdot r_o(r_o + R_2) \cdot M}{(r_o + R_2)^2 + \omega^2 L_2^2}\right)$$

The quality factor ($Q_{\textit{eff}}$) of the tuning mechanism 931 may be given according to Equation (19):

$$Q_{\textit{eff}} = \frac{\omega L_1((r_o + R_2)^2 + \omega^2 L_2^2) + \omega \alpha \cdot r_o(r_o + R_2) \cdot M}{R_1((r_o + R_2)^2 + \omega^2 L_2^2) + \alpha \cdot r_o \cdot \omega^2 L_2 \cdot M} \quad (19)$$

$$= \frac{\omega L_1}{R_1} + \frac{\omega \alpha \cdot r_o \cdot M}{R_1 \cdot (r_o + R_2)} \because r_o \gg \omega L_2$$

Then, if $r_0 \gg R_2$, the quality factor ($Q_{\textit{eff}}$) of the tuning mechanism 931 may be given according to Equation (20):

$$Q_{\textit{eff}} = \frac{\omega(L_1 + \alpha \cdot M)}{R_1} \quad (19)$$

Therefore, the quality factor of the secondary inductor (L2) 962 may have relatively little impact on the overall quality factor ($Q_{\textit{eff}}$) of the tuning mechanism 931. This may allow for simple implementation of the tuning mechanism 931. In other words, the quality factor of the secondary inductor (L2) 962 may be sacrificed and, instead, the quality factor of the primary inductor (L1) 964 may be optimized, thus reducing complexity because the quality factor of only one of the inductors is being optimized.

Figure 10:
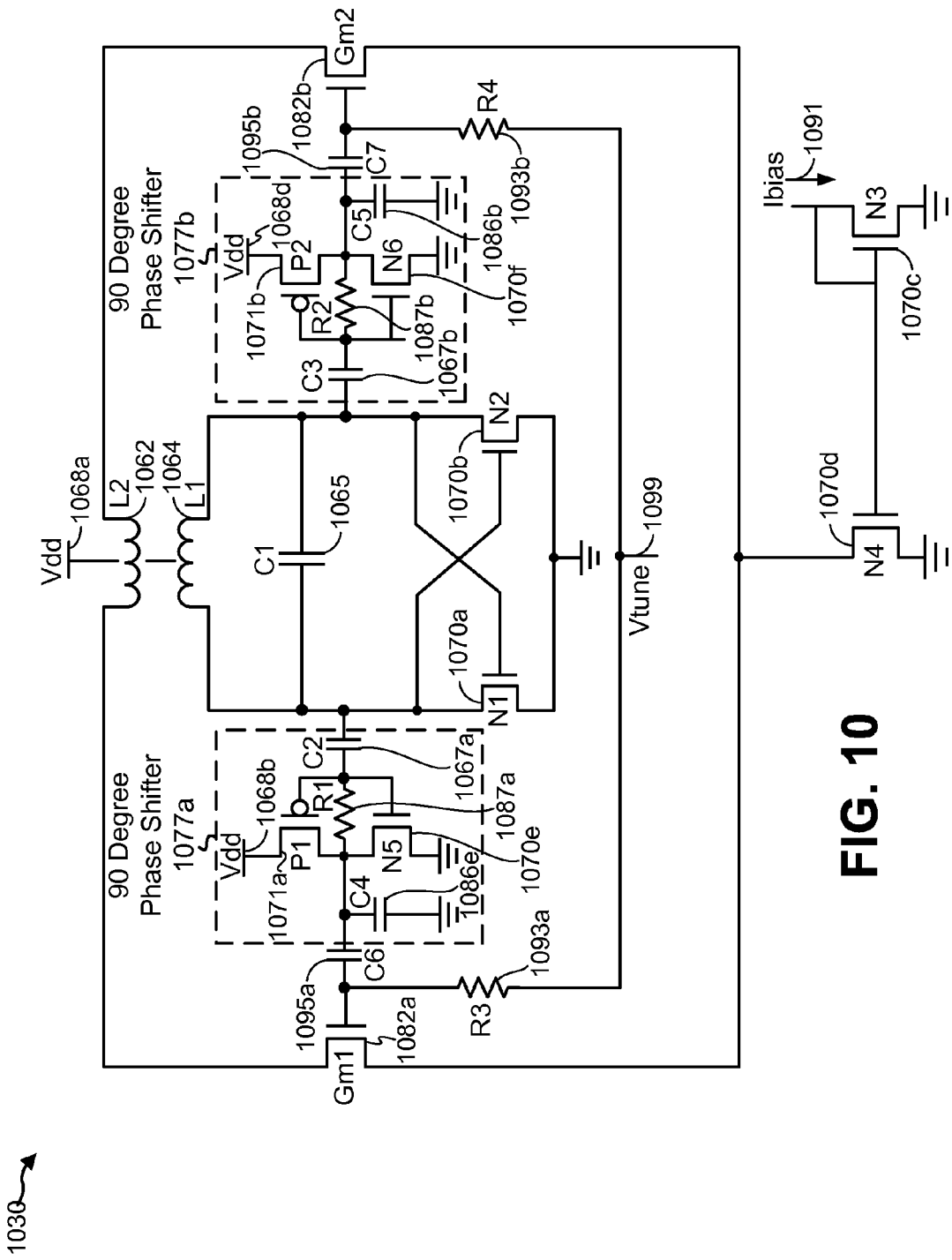
FIG. 10 is a circuit diagram illustrating another configuration of a tunable oscillator.

FIG. 10 is a circuit diagram illustrating another configuration of a tunable oscillator 1030. The tunable oscillator 1030 may include similar elements to the tunable oscillator illustrated in FIG. 7. Specifically, the capacitor bank (C1) 1065, series resistors (R1-R2) 1087a-b, primary inductor (L1) 1064 and secondary inductor (L2) 1062, series capacitors (C2-C3) 1067a-b, shunt capacitor banks (C4-C5) 1086a-b, NMOSFETs (N1-N6) 1070a-f, PMOSFETs (P1-P2) 1071a-b, Vdd 1068a-c, transconductors (Gm1-Gm2) 1082a-b, and 90 degree phase shifters 1077a-b illustrated in FIG. 10 may correspond to and include similar functionality as the capacitor bank (C1) 765, series resistors (R1-R2) 787a-b, primary inductor (L1) 764 and secondary inductor (L2) 762, series capacitors (C2-C3) 767a-b, shunt capacitor banks (C4-C5) 786a-b, NMOSFETs (N1-N6) 770a-f, PMOSFETs (P1-P2) 771a-b, Vdd 768a-c, transconductors (Gm1-Gm2) 782a-b, and 90 degree phase shifters 777a-b illustrated in FIG. 7, respectively. Furthermore, the tunable oscillator 1030 may include biasing resistors (R3-R4) 1093a-b and biasing capacitors (C6-C7) 1095a-b.

In this configuration, however, a tuning voltage (Vtune) 1099 may be used to control the effective Gm of the transconductors (Gm1-Gm2) 1082a-b instead of an input current ($I_{IN}$) 784 that is mirrored into a tuning current (Itune) 778. This may create a voltage controlled oscillator (VCO) instead of a current controlled oscillator (ICO) illustrated in FIG. 7. The current input to the third NMOSFET (N3) 1070c and mirrored at the fourth NMOSFET (N4) 1070d is instead a biasing current (Ibias) 1091. By biasing the transconductors (Gm1-Gm2) 1082a-b, the biasing current (Ibias) 1091 may adjust the $k_{vco}$ characteristics. Adjusting the size of the transconductors (Gm1-Gm2) 1082a-b may also affect the $k_{vco}$ characteristics.

The VCO configuration 1030 may be combined with the ICO configuration 730 in FIG. 7 in a single oscillator. This combined oscillator may be compatible with a digital phase locked loop providing a tuning current (Itune) 778 and an analog phase locked loop providing a tuning voltage (Vtune) 1099. However, the $K_{vco}$ of the VCO configuration 1030 may be less linear than the $K_{ICO}$ configuration 730.

Figure 11:
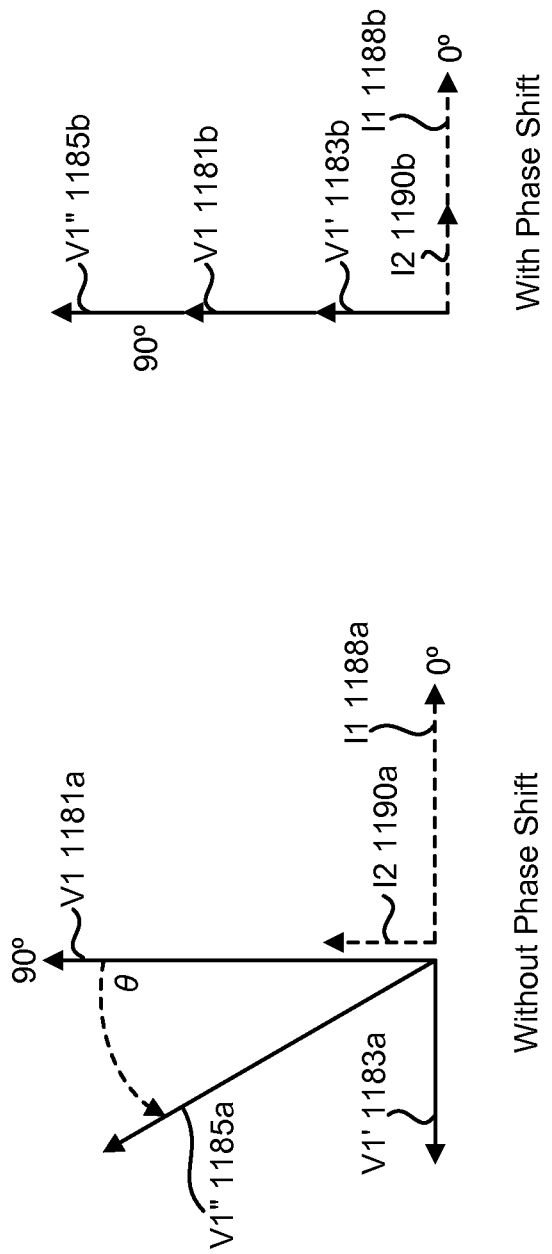
FIG. 11 is a diagram illustrating the effect of a 90 degree phase shifters to signals in a tunable oscillator.

FIG. 11 is a diagram illustrating the effect of a 90 degree phase shifter 1077a-b to signals in a tunable oscillator 1030. Without a 90 degree phase shifter 1077a-b, the primary inductor current (I1) 1188a may be 90 degrees out-of-phase with the secondary inductor current (I2) 1190a. In contrast, a 90 degree phase shifter 1077a-b may align the primary inductor current (I1) 1188b either in-phase (shown) or 180 degrees out-of-phase with the secondary inductor current (I2) 1190b.

Without a 90 degree phase shifter 1077a-b, V1 1181a, V1' 1183a and V1" 1185a may be out-of-phase with each other. In contrast, V1 1181b, V1' 1183b and V1" 1185b may be in-phase with each other if a 90 degree phase shifter 1077a-b is used. V1 1181a-b may be the amplitude of the oscillating signal from the first stage, V1' 1183a-b may be oscillating signal from the second stage and V1" 1185a-b may be the vector sum of V1 1181a-b and V1' 1183a-b.

Figure 12:
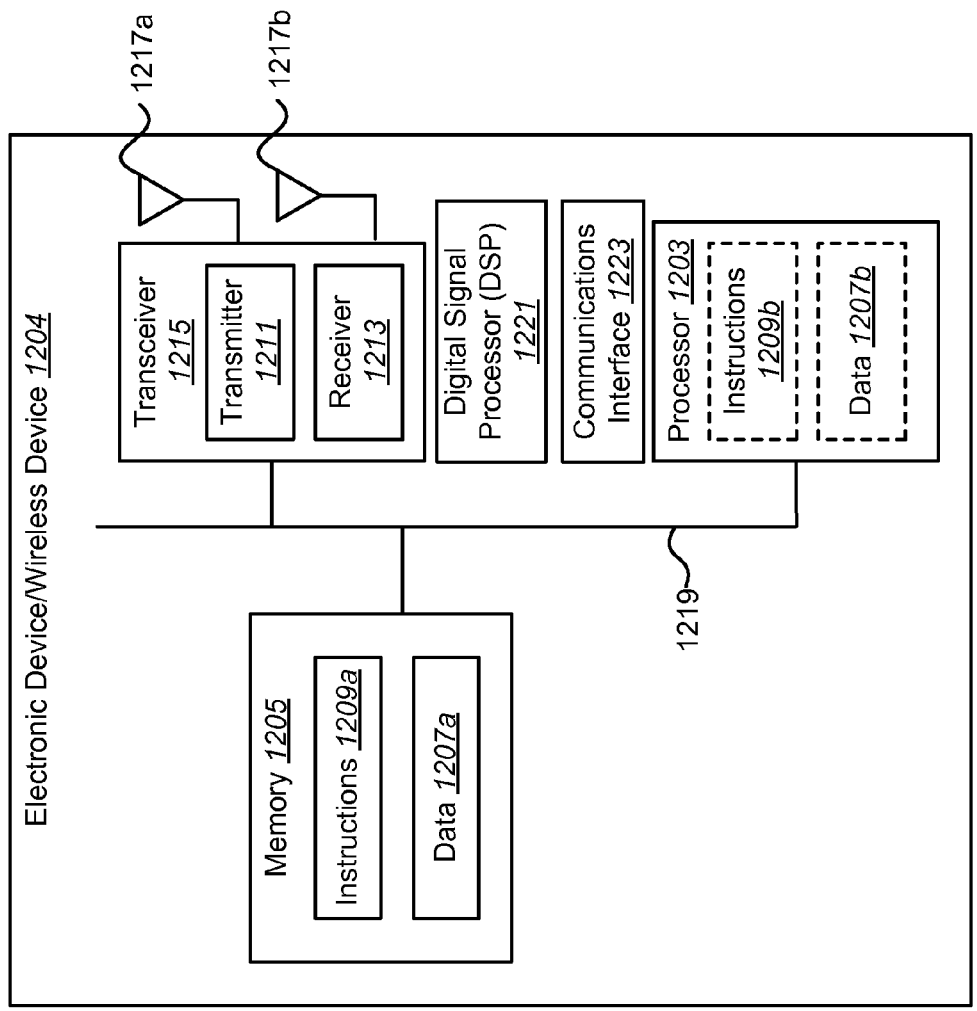
FIG. 12 illustrates certain components that may be included within an electronic device/wireless device.

FIG. 12 illustrates certain components that may be included within an electronic device/wireless device 1204. The electronic device/wireless device 1204 may be an access terminal, a mobile station, a user equipment (UE), a base station, an access point, a broadcast transmitter, a node B, an evolved node B, etc. For example, the electronic device/wireless device 1204 may include the receiver 100 or transmitter 200 illustrated in FIGS. 1 and 2, respectively. The electronic device/wireless device 1204 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the electronic device/wireless device 1204 of FIG. 12, in an alternative configuration, a combination of processors (e.g., an ARM and DSP) could be used.

The electronic device/wireless device 1204 also includes memory 1205. The memory 1205 may be any electronic component capable of storing electronic information. The memory 1205 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1207*a* and instructions 1209*a* may be stored in the memory 1205. The instructions 1209*a* may be executable by the processor 1203 to implement the methods disclosed herein. Executing the instructions 1209*a* may involve the use of the data 1207*a* that is stored in the memory 1205. When the processor 1203 executes the instructions 1209*a*, various portions of the instructions 1209*b* may be loaded onto the processor 1203, and various pieces of data 1207*b* may be loaded onto the processor 1203.

The electronic device/wireless device 1204 may also include a transmitter 1211 and a receiver 1213 to allow transmission and reception of signals to and from the electronic device/wireless device 1204. The transmitter 1211 and receiver 1213 may be collectively referred to as a transceiver 1215. Multiple antennas 1217*a-b* may be electrically coupled to the transceiver 1215. The electronic device/wireless device 1204 may also include (not shown) multiple transmitters, multiple receivers, multiple transceivers and/or additional antennas.

The electronic device/wireless device 1204 may include a digital signal processor (DSP) 1221. The electronic device/wireless device 1204 may also include a communications interface 1223. The communications interface 1223 may allow a user to interact with the electronic device/wireless device 1204.

The various components of the electronic device/wireless device 1204 may be coupled together by one or more buses, which may include a power bus, a control signal bus, a status signal bus, a data bus, etc. For the sake of clarity, the various buses are illustrated in FIG. 12 as a bus system 1219.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A tunable oscillator circuit, comprising:
an inductor/capacitor (LC) tank circuit comprising a primary inductor coupled in parallel with a first varactor-less capacitor bank, wherein the LC tank circuit resonates to produce an oscillating voltage at a frequency;
a 90 degree phase shift buffer coupled to the LC tank circuit and to a transconductor, wherein the 90 degree phase shift buffer includes a programmable shunt capacitor bank with a first node coupled to the transconductor, wherein the transconductor includes a first n-type metal oxide semiconductor (NMOS) transistor that receives a tuning current at a first source and a tuning voltage at a first gate, wherein the tuning current corresponds to an input current from a digital phase locked loop that is mirrored via a second NMOS transistor, and wherein the tuning voltage corresponds to an input voltage from an analog phase locked loop; and
a secondary inductor coupled to the transconductor, wherein the secondary inductor is inductively coupled to the primary inductor and receives a gain-scaled oscillating current from the transconductor.

2. The tunable oscillator circuit of claim 1, wherein the 90 degree phase shift buffer phase-shifts the oscillating voltage by 90 degrees.

3. The tunable oscillator circuit of claim 2, wherein the transconductor converts the phase shifted oscillating voltage into the gain-scaled oscillating current.

4. The tunable oscillator circuit of claim 1, wherein the programmable shunt capacitor bank is programmable.

5. The tunable oscillator circuit of claim 1, wherein the tuning current changes the gain-scaled oscillating current passed to the secondary inductor, an effective inductance of the primary inductor, and the frequency of the oscillating voltage.

6. The tunable oscillator circuit of claim 1, wherein the tuning voltage changes the gain-scaled oscillating current passed to the secondary inductor, an effective inductance of the primary inductor, and the frequency of the oscillating voltage.

7. The tunable oscillator circuit of claim 1, wherein the 90 degree phase shift buffer further comprises:
a capacitor, wherein a first node of the capacitor is coupled to the inductor/capacitor (LC) tank circuit and a second node of the capacitor is coupled to a first node of a resistor;
a third NMOS transistor with a source node coupled to ground; and
a first p-type metal-oxide-semiconductor (PMOS) transistor with a source node coupled to a reference voltage (Vdd), wherein gates of the third NMOS transistor and the first PMOS transistor are coupled to the second node of the capacitor and the first node of the resistor;
wherein the first node of the programmable shunt capacitor bank is further coupled to a second node of the resistor and to the drains of the third NMOS transistor and the first PMOS transistor, wherein a second node of the programmable shunt capacitor bank is selectively coupled to ground.

8. The tunable oscillator circuit of claim 1, wherein the programmable shunt capacitor bank is programmable via a three bit control signal to perform at least one of noise reverse isolation or current gain compensation.

9. The tunable oscillator circuit of claim 1, wherein the tuning current has a gain variation within a two percent range over an 18 megahertz (MHz) bandwidth.

10. The tunable oscillator circuit of claim 1, wherein the tuning current has a gain variation within a six percent rage over a 40 megahertz (MHz) bandwidth.

11. The tunable oscillator circuit of claim 1, wherein the tuning voltage corresponds to the input voltage biased by a resistor.

12. An integrated circuit for inductively tuning an oscillator, comprising:
an inductor/capacitor (LC) tank circuit comprising a primary inductor coupled in parallel with a first varactor-less capacitor bank, wherein the LC tank circuit resonates to produce an oscillating voltage at a frequency;
a 90 degree phase shift buffer coupled to the LC tank circuit and to a transconductor, wherein the 90 degree phase shift buffer includes a programmable shunt capacitor bank with a first node coupled to the transconductor, wherein the transconductor includes a first n-type metal oxide semiconductor (NMOS) transistor that receives a tuning current at a first source and a tuning voltage at a first gate, wherein the tuning current corresponds to an input current from a digital phase locked loop that is mirrored via a second NMOS transistor, and wherein the tuning voltage corresponds to an input voltage from an analog phase locked loop; and
a secondary inductor coupled to the transconductor, wherein the secondary inductor is inductively coupled to the primary inductor and receives a gain-scaled oscillating current from the transconductor.

13. The integrated circuit of claim 12, wherein the 90 degree phase shift buffer phase-shifts the oscillating voltage by 90 degrees.

14. The integrated circuit of claim 13, wherein the transconductor converts the phase-shifted oscillating voltage into the gain-scaled oscillating current.

15. The integrated circuit of claim 12, wherein the programmable shunt capacitor bank is programmable.

16. The integrated circuit of claim 12, wherein the tuning current changes the gain-scaled oscillating current passed to the secondary inductor, an effective inductance of the primary inductor, and the frequency of the oscillating voltage.

17. The integrated circuit of claim 12, wherein the tuning voltage changes the gain-scaled oscillating current passed to the secondary inductor, an effective inductance of the primary inductor, and the frequency of the oscillating voltage.

18. The integrated circuit of claim 12, wherein the 90 degree phase shift buffer further comprises:
a capacitor, wherein a first node of the capacitor is coupled to the inductor/capacitor (LC) tank circuit and a second node of the capacitor is coupled to a first node of a resistor;
a third NMOS transistor with a source node coupled to ground; and
a first p-type metal-oxide-semiconductor (PMOS) transistor with a source node coupled to a reference voltage (Vdd), wherein gates of the third NMOS transistor and the first PMOS transistor are coupled to the second node of the capacitor and the first node of the resistor;
wherein the first node of the programmable shunt capacitor bank is further coupled to a second node of the resistor and to the drains of the third NMOS transistor and the first PMOS transistor, wherein a second node of the programmable shunt capacitor bank is selectively coupled to ground.

19. The integrated circuit of claim 12, wherein the programmable shunt capacitor bank is programmable via a three bit control signal to perform at least one of noise reverse isolation or current gain compensation.

20. A tunable oscillator circuit, comprising:
   means for generating an oscillating voltage using a first varactorless capacitor bank and a primary inductor;
   means for buffering and phase-shifting the oscillating voltage that includes a programmable shunt capacitor bank with a first node coupled to a transconductor, wherein the transconductor includes a first n-type metal oxide semiconductor (NMOS) transistor that receives a tuning current at a first source and a tuning voltage at a first gate, wherein the tuning current corresponds to an input current from a digital phase locked loop that is mirrored via a second NMOS transistor, wherein the tuning voltage corresponds to an input voltage from an analog phase locked loop, and wherein the transconductor is coupled to the means for buffering and phase-shifting;
   means for converting the shifted oscillating voltage into a gain-scaled oscillating current; and
   means for changing a frequency of the oscillating voltage by changing the effective inductance of the primary inductor using the oscillating current.

21. A method for inductively tuning an oscillator, comprising: generating an oscillating voltage using a first varactorless capacitor bank and a primary inductor; buffering and phase-shifting the oscillating voltage using a 90 degree phase shift buffer, wherein the 90 degree phase shift buffer includes a programmable shunt capacitor bank having a first node coupled to a transconductor, wherein the transconductor includes a first n-type metal oxide semiconductor (NMOS) transistor that receives a tuning current at a first source and a tuning voltage at a first gate, wherein the tuning current corresponds to an input current from a digital phase locked loop that is mirrored via a second NMOS transistor, and wherein the tuning voltage corresponds to an input voltage from an analog phase locked loop; converting the shifted oscillating voltage into a gain-scaled oscillating current using the transconductor; and changing a frequency of the oscillating voltage by changing the effective inductance of the primary inductor using the oscillating current.

22. The method of claim 21, wherein the programmable shunt capacitor bank is programmable.

23. The method of claim 21, wherein the tuning current changes the gain-scaled oscillating current passed to the secondary inductor, an effective inductance of the primary inductor, and the frequency of the oscillating voltage.

24. The method of claim 21, wherein the tuning voltage changes the gain-scaled oscillating current passed to the secondary inductor, an effective inductance of the primary inductor, and the frequency of the oscillating voltage.

25. The method of claim 21, wherein the 90 degree phase shift buffer further comprises:
   a capacitor, wherein a first node of the capacitor is coupled to an inductor/capacitor (LC) tank circuit and a second node of the capacitor is coupled to a first node of a resistor;
   a third NMOS transistor with a source node coupled to ground; and
   a first p-type metal-oxide-semiconductor (PMOS) transistor with a source node coupled to a reference voltage (Vdd), wherein gates of the third NMOS transistor and the first PMOS transistor are coupled to the second node of the capacitor and the first node of the resistor;
   wherein the first node of the programmable shunt capacitor bank is further coupled to a second node of the resistor and to the drains of the third NMOS transistor and the first PMOS transistor, wherein a second node of the programmable shunt capacitor bank is selectively coupled to ground.

26. The method of claim 21, further comprising programming the programmable shunt capacitor bank to create a different capacitance based on process or temperature during operation of the oscillator.

27. The method of claim 21, wherein the programmable shunt capacitor bank is programmable to perform noise reverse isolation via a three bit control signal.

28. The method of claim 21, wherein the programmable shunt capacitor bank is programmable to perform current gain compensation via a three bit control signal.

* * * * *